(12) United States Patent
Ri

(10) Patent No.: US 12,121,976 B2
(45) Date of Patent: Oct. 22, 2024

(54) COATED TOOL AND CUTTING TOOL

(71) Applicant: KYOCERA Corporation, Kyoto (JP)

(72) Inventor: Kou Ri, Satsumasendai (JP)

(73) Assignee: KYOCERA Corporation

( * ) Notice: Subject to any disclaimer, the term of this patent is extended or adjusted under 35 U.S.C. 154(b) by 502 days.

(21) Appl. No.: 17/609,255

(22) PCT Filed: May 23, 2020

(86) PCT No.: PCT/JP2020/020431
§ 371 (c)(1),
(2) Date: Nov. 5, 2021

(87) PCT Pub. No.: WO2020/241533
PCT Pub. Date: Dec. 3, 2020

(65) Prior Publication Data
US 2022/0226906 A1    Jul. 21, 2022

(30) Foreign Application Priority Data
May 29, 2019 (JP) .................................. 2019-100405

(51) Int. Cl.
*B23B 27/14* (2006.01)
*C23C 16/30* (2006.01)
*C23C 16/36* (2006.01)
*C23C 16/40* (2006.01)

(52) U.S. Cl.
CPC .......... *B23B 27/148* (2013.01); *C23C 16/303* (2013.01); *C23C 16/36* (2013.01); *C23C 16/403* (2013.01)

(58) Field of Classification Search
None
See application file for complete search history.

(56) References Cited

U.S. PATENT DOCUMENTS

| 5,770,261 A * | 6/1998 | Nakamura | C23C 16/40 |
| | | | 427/255.19 |
| 2007/0054146 A1 | 3/2007 | Aizawa et al. | |
| 2011/0058909 A1 | 3/2011 | Matsuzawa | |

(Continued)

FOREIGN PATENT DOCUMENTS

| CN | 101952070 A | 1/2011 |
| JP | 10-109206 A | 4/1998 |

(Continued)

*Primary Examiner* — Seth Dumbris
(74) *Attorney, Agent, or Firm* — Volpe Koenig

(57) ABSTRACT

A coated tool includes a base and a coating layer. The coating layer includes a first layer including TiCN, a second layer including $Al_2O_3$, and a third layer including at least one of TiN and TiCN. Cl content included in the first, second and third layers is first, second and third Cl content. Each of the first Cl content and the third Cl content is larger than the second Cl content. The first Cl content is more than 0.2 atomic % and not more than 2 atomic %. The third Cl content is more than 0.2 atomic % and not more than 2 atomic %. A cutting tool of the present disclosure includes a holder which has a length from a first end to a second end and includes a pocket on a side of the first end; and the coated tool located in the pocket.

7 Claims, 4 Drawing Sheets

(56) References Cited

U.S. PATENT DOCUMENTS

| | | | |
|---|---|---|---|
| 2013/0216777 A1* | 8/2013 | Jiang | C23C 16/36 |
| | | | 977/773 |
| 2015/0158094 A1* | 6/2015 | Igarashi | C23C 16/0272 |
| | | | 427/249.19 |
| 2016/0333478 A1 | 11/2016 | Tatsuoka et al. | |
| 2017/0029944 A1 | 2/2017 | Kubo et al. | |
| 2018/0339415 A1 | 11/2018 | Yoshimura et al. | |

FOREIGN PATENT DOCUMENTS

| | | |
|---|---|---|
| JP | 2012-192480 A | 10/2012 |
| JP | 2018-030193 A | 3/2018 |
| JP | 2018-034216 A | 3/2018 |
| WO | 2004/096473 A1 | 11/2004 |
| WO | 2015/099047 A1 | 7/2015 |
| WO | 2015/105177 A1 | 7/2015 |

\* cited by examiner

COATED TOOL AND CUTTING TOOL

TECHNICAL FIELD

The present disclosure relates to a coated tool and a cutting tool.

BACKGROUND

Patent Document 1 discusses that high-speed machining parts having high wear resistance during high-speed machining are obtainable by ion implantation of halogen element and the like into a surface of a cutting tool. However, there is the problem that machining conditions of 150 m/min or more needs to be satisfied to ensure high wear resistance of the high-speed machining parts after subjected to the ion implantation, and wear resistance may be deteriorated at speeds lower than that. There is also the problem that an apparatus and the step for the ion implantation into the surface of the cutting tool are necessary for carrying out the invention disclosed in Patent Document 1, thus leading to high costs for the cutting tool. Because ions move from a surface of a coating layer to the interior thereof during the ion implantation, a chlorine concentration is high on a side of the surface of the coating layer, and the chlorine concentration is low on a side of a base of the coating layer. This can cause the problem that it is difficult to obtain sufficient effect on the side of the base of the coating layer.

Patent Document 2 discusses a coated tool with a coating layer, in which the coating layer may include chlorine derived from a raw material gas during deposition even if including no ion implantation. Paragraph 0096 in Patent Document 2 says that residual chlorine correlates to film quality of a hard coating film and the film quality becomes better with decreasing the residual chlorine.

Patent Document 3 discusses a cutting tool in which an outermost surface layer of a coating layer has a lower chlorine content than a Ti($C_{x1}N_{y1}O_{z1}$) layer located closer to a base than the outermost surface layer.

RELATED ART DOCUMENTS

Patent Document

Patent Document 1: WO 2004/096473
Patent Document 2: WO 2015/105177
Patent Document 3: WO 2015/099047

SUMMARY

Problems to be Solved by the Invention

A coated tool and a cutting tool are provided which are excellent in fracture resistance.

Means for Solving the Problems

A coated tool of the present disclosure includes a base and a coating layer located on the base. The coating layer includes, in order from a side of the base, a first layer including TiCN, a second layer including $Al_2O_3$, and a third layer including at least one of TiN and TiCN. A Cl content included in the first layer is a first Cl content, a Cl content included in the second layer is a second Cl content, and a Cl content included in the third layer is a third Cl content. Each of the first Cl content and the third Cl content is larger than the second Cl content. The first Cl content is more than 0.2 atomic % and not more than 2 atomic %. The third Cl content is more than 0.2 atomic % and not more than 2 atomic %. A cutting tool of the present disclosure includes a holder which has a length from a first end to a second end and includes a pocket on a side of the first end, and the coated tool located in the pocket.

EMBODIMENT

Figure 1:
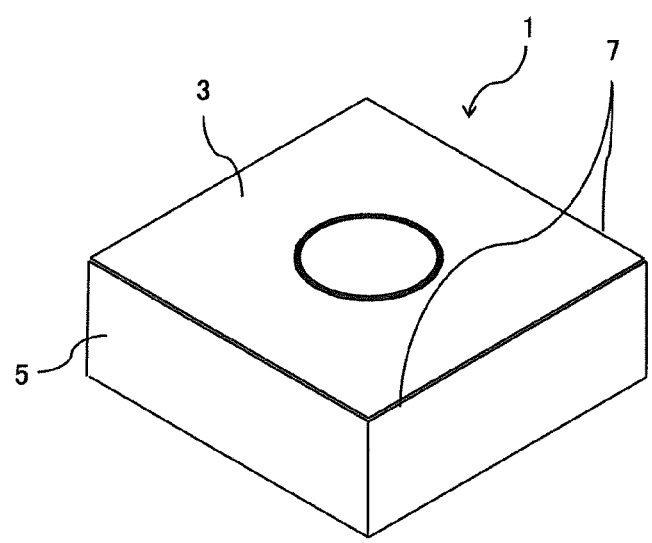
FIG. 1 is a perspective view illustrating an embodiment of coated tools in the present disclosure.

Coated tools and cutting tools of the present disclosure are described in detail below with reference to the drawings. The drawings referred to in the following illustrate, in simplified form, only main parts necessary for the sake of description.

<Coated Tools>

Coated tools of the present disclosure are described in detail below. For the sake of description, the drawings referred to in the following illustrate, in simplified form, only main members necessary for describing the embodiments. Hence, the coated tools of the present disclosure may include any arbitrary structural member not illustrated in the drawings referred to. Dimensions of the members in each of the drawings faithfully represent neither dimensions of actual structural members nor dimensional ratios of these members. These points are also true for cutting tools described later.

The coated tool 1 of the present disclosure has a quadrangular plate shape, and includes a first surface 3 having a quadrangular shape (an upper surface in FIG. 1), a second surface 5 (a lateral surface in FIG. 1), and a cutting edge 7 located on at least a part of a ridgeline where the first surface 3 intersects with the second surface 5. The first surface 3 is a so-called rake surface. The second surface is a so-called flank surface.

Although the whole of an outer periphery of the first surface 3 may be the cutting edge 7 in the coated tool 1 of the present disclosure, the coating tool 1 is not limited thereto. For example, only one side of the first surface 3 having the quadrangular shape may include the cutting edge 7, or alternatively, the first surface 3 may partially include the cutting edge 7.

Although dimensions of the coated tool 1 are not particularly limited, for example, a length of one side of the first surface 3 may be 3-20 mm. A height from the first surface 3 to a third surface located on a side opposite to the first surface 3 may be approximately 5-20 mm.

Figure 2:
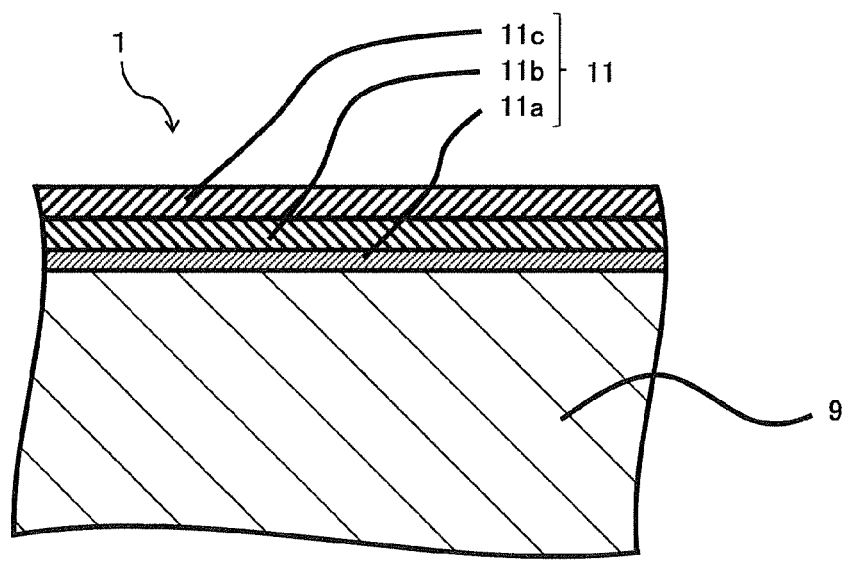
FIG. 2 is a schematic diagram illustrating a cross section of an embodiment of the coated tools in the present disclosure.

The coated tool 1 of the present disclosure includes a base 9 and a coating layer 11 to cover a surface of the base 9 as illustrated in FIG. 2. The base 9 may be cemented carbide, cermet, cBN, ceramics, or the like. The coating layer 11 may cover the whole or a part of the surface of the base 9. If the coating layer 11 covers the part of the base 9, it can be rephrased that the coating layer 11 is located on at least the part of the base 9.

The coating layer 11 in the coated tool 1 of the present disclosure is located on the base 9 as illustrated in FIG. 2. The coating layer 11 includes, in order from a side of the base 9, a first layer 11a including TiCN, a second layer 11b including $Al_2O_3$, and a third layer 11c including at least one of TiN and TiCN.

FIG. 2 illustrates an embodiment that the first layer 11a is located on the surface of the base 9. For example, a TiN layer (not illustrated) may be located on the surface of the base 9. A different layer may be located between the first layer 11a and the second layer 11b. A different layer may be located between the second layer 11b and the third layer 11c.

Both the first layer 11a and the third layer 11c include Cl. Including Cl denotes that Cl is detectable upon measurement of a cross section of the coating layer 11 by using a WDS (Wavelength Dispersive x-ray Spectroscopy).

A Cl content (atomic %) included in the first layer 11a is a first Cl content, a Cl content (atomic %) included in the second layer 11b is a second Cl content, and a Cl content (atomic %) included in the third layer 11c is a third Cl content.

Each of the first Cl content and the third Cl content is larger than the second C content in the coated tool 1 of the present disclosure. In other words, the Cl content included in each of the first layer 11a and the third layer 11c is larger than the Cl content included in the second layer 11b. The Cl content of the second layer 11b may be a detection limit or less.

The first Cl content is more than 0.2 atomic % and not more than 2 atomic %. The third Cl content is more than 0.2 atomic % and not more than 2 atomic %.

The first layer 11a, the second layer 11b and the third layer 11c may be individually a single layer or a laminate of a plurality of layers.

As used herein, TiCN in the first layer 11a denotes one which includes Ti, C and N. If including C and N, a ratio of C and N may not be 1:1.

The second layer 11b is a layer including $Al_2O_3$. Alternatively, $Al_2O_3$ may be $\alpha$-$Al_2O_3$ or $\kappa$-$Al_2O_3$.

The third layer 11c may include both TiN and TiCN, or may include one of TiN and TiCN. As used herein, TiCN may include C and N, and a ratio of C and N may not be 1:1.

A thickness of the first layer 11a may be 5-20 μm. A thickness of the second layer 11b may be 2-12 μm. A thickness of the third layer 11c may be 0.5-3 μm.

A thickness of the coating layer 11 may be, for example, 5-30 μm. The thickness of the coating layer 11 may be kept constant or may be different depending on location.

Figure 3:
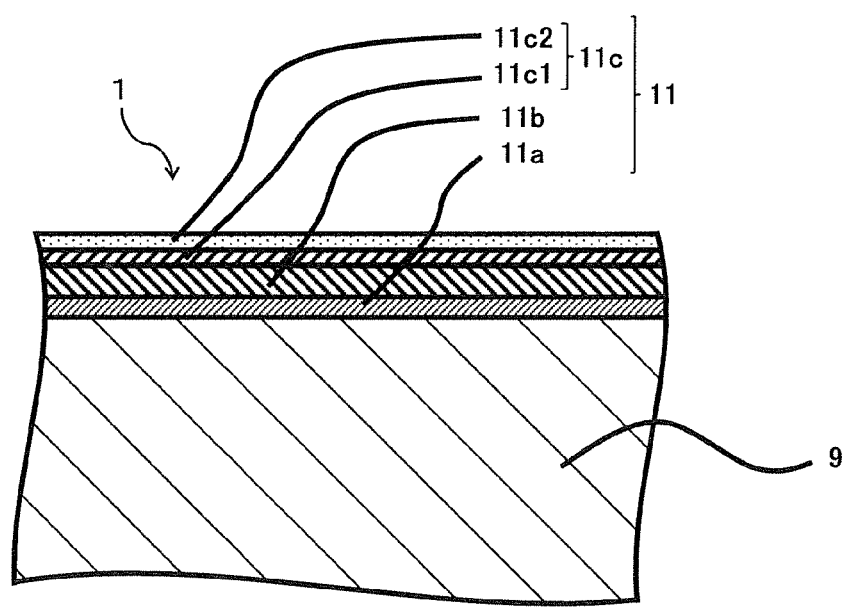
FIG. 3 is a schematic diagram illustrating a cross section of other embodiment of the coated tools in the present disclosure.

FIG. 3 illustrates an embodiment that the third layer 11c is a multilayer. The third layer 11c includes a primary third layer 11c1 located closer to the base 9, and a secondary third layer 11c2 located on the primary third layer 11c1.

Specific embodiments include one in which the primary third layer 11c1 includes TiCN and the secondary third layer 11c2 includes TiN. Alternatively, the primary third layer 11c1 may include TiN, and the secondary third layer 11c2 may include TiCN.

If the third layer 11c is formed by the plurality of layers, there are advantages that color control is performable arbitrarily and a part of the third layer 11c being exposed is easily distinguishable.

The first layer 11a may also be a multilayer, and may include for example, a primary first layer (not illustrated) located closer to the base 9, and a secondary first layer located on the primary first layer (not illustrated). The primary first layer may be an MT-TiCN layer. The secondary first layer may be an HT-TiCN layer.

The second layer 11b may also be a multilayer, and may include, for example, a primary second layer (not illustrated) located closer to the base 9, and a secondary second layer (not illustrated) located on the primary second layer. The primary second layer and the secondary second layer may include $\alpha$-$Al_2O_3$. The primary second layer and the secondary second layer may include $\kappa$-$Al_2O_3$. The primary second layer and the secondary second layer may be different in $\alpha$-$Al_2O_3$ content.

A Cl content in individual layers may be measured in a cross section of the coating layer 11 by using, for example, a wavelength-dispersive EPMA (JXA-8530F) manufactured by NIHON DENSHI.

The coated tool 1 of the present disclosure is excellent in fracture resistance because of the above configuration. The coated tool 1 also has enhanced wear resistance both in low-speed machining at a machining speed of lower than 150 m/min and in high-speed machining at a machining speed of 150 m/min or higher.

The first Cl content of the coated tool 1 of the present disclosure may be 0.7 atomic % or less. This configuration leads to an excellent balance between wear resistance and fracture resistance.

The first Cl content of the coated tool 1 of the present disclosure may be more than 0.7 atomic %. With this configuration, the coated tool 1 is particularly excellent in fracture resistance.

The third Cl content of the coated tool 1 of the present disclosure may be 0.7 atomic % or less. This configuration leads to an excellent balance between wear resistance and fracture resistance.

The third Cl content of the coated tool 1 of the present disclosure may be more than 0.7 atomic %. With this configuration, the coated tool 1 is particularly excellent in fracture resistance.

The third Cl content of the coated tool 1 of the present disclosure may be 0.9 atomic % or more. With this configuration, the coated tool 1 is further excellent in fracture resistance.

The third Cl content may be larger than the first Cl content in the coated tool 1 of the present disclosure. This configuration leads to excellent fracture resistance.

<Cutting Tools>

A cutting tool of the present disclosure is described below with reference to the drawings.

Figure 4:
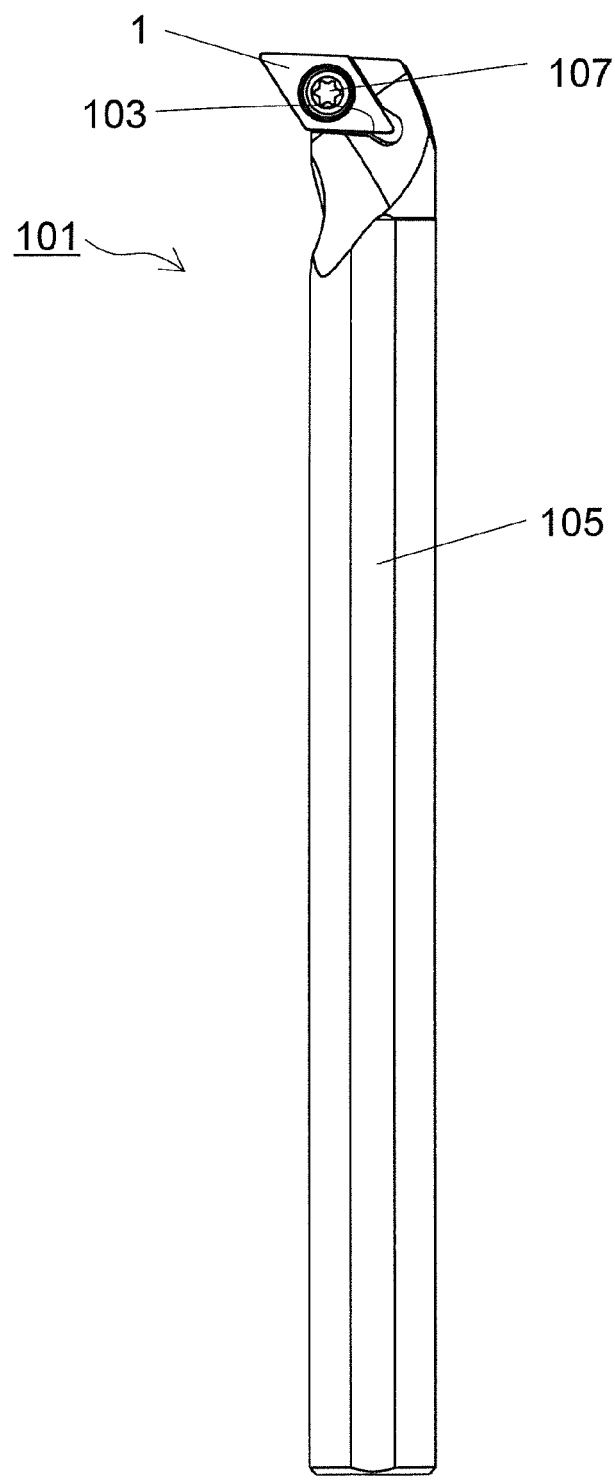
FIG. 4 is a front view illustrating an embodiment of cutting tools in the present disclosure.

As illustrated in FIG. 4, the cutting tool 101 of the present disclosure is, for example, a bar-shaped body extended from a first end (an upper end in FIG. 4) toward a second end (a lower end in FIG. 4).

As illustrated in FIG. 4, the cutting tool 101 includes a holder 105 having a length from the first end (front end) to the second end and including a pocket 103 located on a side of the first end, and the coated tool 1 located in the pocket 103. The cutting tool 101 includes the coated tool 1 excellent in fracture resistance, and is therefore capable of carrying out a stable cutting process for a long period of time.

The pocket 103 is a part that permits attachment of the coated tool 1. The pocket 103 includes a seating surface parallel to a lower surface of the holder 105, and a constraining lateral surface vertical or inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a ridgeline where the first surface 3 serving as a rake surface intersects with the second surface 5 serving as a flank surface, which is usable as the cutting edge 7, is protruded outward from the holder 105. The coated tool 1 is attached to the holder 105 with a screw 107 in the present embodiment. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as a material of the holder 105. Of these materials, highly rigid steel may be used.

The present embodiment illustrates and describes the cutting tool 101 for use in the so-called turning process. Examples of the turning process include inner diameter processing, outer diameter processing and grooving process. The cutting tool is not limited to one which is used for the turning process. For example, the coated tools 1 of the above embodiments may be used for cutting tools used in a milling process.

<Manufacturing Methods>

A method for manufacturing a coated tool in the present disclosure is described below. Firstly, a base having a predetermined shape is prepared. Cemented carbide including WC, cermet including TiCN, boron nitride and silicon nitride are usable for the base.

Subsequently, a first layer, a second layer and a third layer are deposited on a surface of the base. These layers may be deposited by CVD method.

Suitable deposition conditions for depositing the first layer on the base are a deposition temperature of 600-940° C. and a pressure of 5-25 kPa. The deposition is carried out bypassing through a mixed gas composed of 10-20 vol % of titanium tetrachloride ($TiCl_4$) gas, 1-50 vol % of nitrogen ($N_2$) gas, 0.1-3.0 vol % of acetonitrile ($CH_3CN$) gas, 1.0-15.0 vol % of hydrogen chloride (HCl) gas, and the rest, namely, hydrogen ($H_2$) gas. Of these conditions, a control of titanium tetrachloride ($TiCl_4$) gas content makes it possible to control the first Cl content. The first Cl content increases with increasing a proportion of the titanium tetrachloride ($TiCl_4$) gas included in a deposition gas. The first Cl content increases with decreasing the deposition temperature. In order that the carbon content in the above composition is kept unchanged as a carbon source, the acetonitrile ($CH_3CN$) gas may be changed to methane ($CH_4$) gas, or a mixed gas of both may be passed through. Alternatively, a film of two or more layers may be deposited to control the structure of the first layer.

Deposition conditions of the second layer are described below. In an embodiment of specific deposition conditions, a deposition temperature is 700-1010° C. and a pressure is 5-10 kPa. The deposition is carried out by passing through a mixed gas composed of 0.5-20.0 vol % of aluminum trichloride ($AlCl_3$) gas, 0.5-5.0 vol % of hydrogen chloride (HCl) gas, 0.5-5.0 vol % of carbon dioxide ($CO_2$) gas, 0-0.5 vol % of hydrogen sulfide ($H_2S$) gas, and the rest, namely, hydrogen ($H_2$) gas. Of these conditions, a control of aluminum trichloride ($AlCl_3$) gas content makes it possible to control the second Cl content. The second Cl content may be smaller than each of the first Cl content and the third Cl content, and may be controlled suitably depending on the first Cl content and the third Cl content.

Subsequently, deposition conditions of the third layer are described below. The third layer may include at least one of TiN and TiCN. An embodiment that the third layer includes TiN is first described, and an embodiment that the third layer includes TiCN is then described.

The third layer including TiN is deposited at a deposition temperature of 600-940° C. and a pressure of 8-50 kPa by passing through a mixed gas composed of 10-20 vol % of titanium tetrachloride ($TiCl_4$) gas, 10-50 vol % of nitrogen ($N_2$) gas, 1.0-15.0 vol % of hydrogen chloride (HCl) gas content, and the rest, namely, hydrogen ($H_2$) gas. Of these conditions, a control of titanium tetrachloride ($TiCl_4$) gas content makes it possible to control the third Cl content.

The third layer including TiCN is deposited at a deposition temperature of 600-940° C. and a pressure of 5-25 kPa by passing through a mixed gas composed of 10-20 vol % of titanium tetrachloride ($TiCl_4$) gas, 1-50 vol % of nitrogen ($N_2$) gas, 0.1-6.0 vol % of acetonitrile ($CH_3CN$) gas, 1.0-15.0 vol % of hydrogen chloride (HCl) gas, and the rest, namely, hydrogen ($H_2$) gas. Of these conditions, a control of titanium tetrachloride ($TiCl_4$) gas makes it possible to control the third Cl content.

An inclination of chlorine concentration in the coating layer, which may occur in ion implantation, can be reduced by manufacturing a coating layer including a predetermined amount of chlorine under the above control of the deposition conditions.

EXAMPLES

A coated tool was manufactured by deposing a coating layer having a structure presented in Table 2 on a surface of abase composed of cemented carbide in the shape of CNMG120408PG under conditions presented in Table 1. A first layer TiCN film was deposited at a deposition temperature of 750° C. and a pressure of 9 kPa. A second layer was deposited at a deposition temperature of 980° C. and a pressure of 9 kPa. Both TiN and TiCN films of a third layer were deposited at a deposition temperature of 850° C. and a pressure of 12 kPa.

TABLE 1

| Deposition No. | | Deposition condition (Vol %) | | | | | | | |
|---|---|---|---|---|---|---|---|---|---|
| | | $TiCl_4$ | $N_2$ | $CH_3CN$ | HCl | $AlCl_3$ | $H_2S$ | $CO_2$ | $H_2$ |
| First layer | 1 | 4.9 | 10.0 | 2.5 | 10.3 | | | | Rest |
| (TiCN layer) | 2 | 10.5 | 10.0 | 2.5 | 10.3 | | | | Rest |
| | 3 | 15.2 | 10.0 | 2.5 | 10.3 | | | | Rest |
| | 4 | 19.2 | 10.0 | 2.5 | 10.3 | | | | Rest |
| | 5 | 20.3 | 10.0 | 2.5 | 10.3 | | | | Rest |
| Second layer | 1 | | | | 4.0 | 4.5 | 0.2 | 3.8 | Rest |
| ($Al_2O_3$ layer) | 2 | | | | 4.0 | 10.4 | 0.2 | 3.8 | Rest |
| | 3 | | | | 4.0 | 14.8 | 0.2 | 3.8 | Rest |
| | 4 | | | | 4.0 | 18.2 | 0.2 | 3 8 | Rest |

TABLE 1-continued

|  |  | Deposition condition (Vol %) | | | | | | | |
|---|---|---|---|---|---|---|---|---|---|
| Deposition No. | | TiCl$_4$ | N$_2$ | CH$_3$CN | HCl | AlCl$_3$ | H$_2$S | CO$_2$ | H$_2$ |
|  | 5 |  |  |  | 4.0 | 20.1 | 0.2 | 3.8 | Rest |
| Third layer | 1 | 4.2 | 12.2 |  | 10.3 |  |  |  | Rest |
| (TiN layer) | 2 | 10.5 | 12.2 |  | 10.3 |  |  |  | Rest |
|  | 3 | 15.2 | 12.2 |  | 10.3 |  |  |  | Rest |
|  | 4 | 19.8 | 12.2 |  | 10.3 |  |  |  | Rest |
|  | 5 | 20.8 | 12.2 |  | 10.3 |  |  |  | Rest |
| Third layer | 6 | 4 | 9.5 | 5 | 10.3 |  |  |  | Rest |
| (TiCN layer) | 7 | 10.5 | 9.5 | 5 | 10.3 |  |  |  | Rest |
|  | 8 | 16.1 | 9.5 | 5 | 10.3 |  |  |  | Rest |
|  | 9 | 19.2 | 9.5 | 5 | 10.3 |  |  |  | Rest |
|  | 10 | 20.5 | 9.5 | 5 | 10.3 |  |  |  | Rest |

TABLE 2

| Sample No. | Deposition condition | | | Cl content (atomic %) | | | Chipping resistance evaluation test (hits) |
|---|---|---|---|---|---|---|---|
|  | First layer | Second layer | Third layer | First Cl content | Second Cl content | Third Cl content |  |
| 1 | 1 | 1 | 1 | ≤0.1 | ≤0.1 | ≤0.1 | 8208 |
| 2 | 1 | 1 | 2 | ≤0.1 | ≤0.1 | 0.23 | 8500 |
| 3 | 2 | 1 | 2 | 0.21 | ≤0.1 | 0.23 | 9470 |
| 4 | 2 | 1 | 3 | 0.21 | ≤0.1 | 1.21 | 11028 |
| 5 | 2 | 1 | 4 | 0.21 | ≤0.1 | 2.00 | 9780 |
| 6 | 3 | 1 | 1 | 1.20 | ≤0.1 | ≤0.1 | 8348 |
| 7 | 3 | 1 | 2 | 1.20 | ≤0.1 | 0.23 | 9320 |
| 8 | 3 | 1 | 3 | 1.20 | ≤0.1 | 1.21 | 11080 |
| 9 | 3 | 1 | 4 | 1.20 | ≤0.1 | 2.00 | 9870 |
| 10 | 3 | 1 | 5 | 1.20 | ≤0.1 | 2.30 | 8422 |
| 11 | 3 | 1 | 6 | 1.20 | ≤0.1 | 0.20 | 8162 |
| 12 | 3 | 1 | 7 | 1.20 | ≤0.1 | 0.21 | 9250 |
| 13 | 3 | 1 | 8 | 1.20 | ≤0.1 | 1.40 | 11088 |
| 14 | 3 | 1 | 9 | 1.20 | ≤0.1 | 1.98 | 9862 |
| 15 | 3 | 1 | 10 | 1.20 | ≤0.1 | 2.10 | 8702 |
| 16 | 4 | 1 | 2 | 2.00 | ≤0.1 | 0.23 | 9380 |
| 17 | 4 | 1 | 3 | 2.00 | ≤0.1 | 1.21 | 11202 |
| 18 | 4 | 1 | 4 | 2.00 | ≤0.1 | 2.00 | 9886 |
| 19 | 5 | 1 | 3 | 2.10 | ≤0.1 | 1.21 | 8423 |

A cross section of each of manufactured coated tools was subjected to mirror polishing, and a Cl content of each of the layers was measured with a wavelength dispersive type EPMA (JXA-8530F) manufactured by NIHON DENSHI. Measured values are presented in Table 2. The first layers in individual samples have the same thickness. This is also true for the second layers and the third layers in the individual samples. Specifically, the thickness of the first layer is 8 μm. The thickness of the second layer is 6 μm. The thickness of the third layer is 1.5 μm.

A TiN layer having a thickness of 1 μm was disposed between a base and the first layer. The TiN layer was deposited at a deposition temperature of 750° C. and a pressure of 9 kPa by passing through a mixed gas composed of 8 vol % of titanium tetrachloride (TiCl$_4$) gas, 10 vol % of nitrogen (N$_2$) gas, and the rest, namely, hydrogen (H$_2$) gas.

A (Ti, Al) CNO layer wad deposited between the first layer and the second layer. The (Ti, Al) CNO layer was firstly deposited under deposition conditions for generating TiCNO. In a specific embodiment of the deposition conditions, the layer is deposited at a deposition temperature of 850° C. and a pressure of 12 kPa by passing through a mixed gas composed of 6 vol % of titanium tetrachloride (TiCl$_4$) gas, 8 vol % of nitrogen (N$_2$) gas, 2 vol % of methane (CH$_4$) gas or acetonitrile (CH$_3$CN) gas, 0.6 vol % of carbon monoxide (CO) gas, and the rest, namely, hydrogen (H$_2$) gas. After the deposition, an Al component of a second layer described later is dispersed, resulting in (Ti, Al) CNO.

A cutting test was conducted using the obtained coated tools under the following machining conditions.

Insert: CNMG120408PG
Steel material: SCM440 with four grooves
Evaluation conditions: Vc=300 m/min, f=3 mm/rev, ap=1.5 mm, wet.

The cutting test was conducted by using the first surface of the coated tool as a rake surface. The cutting test is a so-called chipping resistance evaluation test. An insert life was determined by the number of hits until occurrence of chipping or fracture of an insert edge.

The coated tools of the present disclosure had excellent fracture resistance and a long life.

The coated tools and the cutting tools in the present disclosure are not limited to the above embodiments, and various improvements and changes may be made without departing from the scope of the present disclosure.

DESCRIPTION OF THE REFERENCE NUMERAL 1 coated tool
3 first surface 5 second surface
7 cutting edge
9 base
11 coating layer
11a first layer
11b second layer
11c third layer
11c1 primary third layer
11c2 secondary third layer
101 cutting tool
103 pocket
105 holder

The invention claimed is:

1. A coated tool, comprising:
 a base; and
 a coating layer located on the base, wherein the coating layer, in order from a side of the base, comprises:
  a first layer comprising TiCN and a first Cl content, wherein the first Cl content is more than 0.2 atomic % and not more than 2 atomic %,
  a second layer comprising $Al_2O_3$ and a second Cl content, and
  a third layer comprising a third Cl content and at least one of TiN or TiCN, wherein the third Cl content is more than 0.2 atomic % and not more than 2 atomic %,
 wherein the first Cl content is larger than the second Cl content and the third Cl content is larger than the first Cl content.

2. The coated tool according to claim 1, wherein the first Cl content is 0.7 atomic % or less.

3. The coated tool according to claim 1, wherein the first Cl content is more than 0.7 atomic %.

4. The coated tool according to claim 1, wherein the third Cl content is 0.7 atomic % or less.

5. The coated tool according to claim 1, wherein the third Cl content is more than 0.7 atomic %.

6. The coated tool according to claim 1, wherein the third Cl content is 0.9 atomic % or more.

7. A cutting tool, comprising:
 a holder having a length from a first end to a second end and comprising a pocket on a side of the first end; and
 the coated tool according to claim 1 which is located in the pocket.

* * * * *